(12) United States Patent
Hill et al.

(10) Patent No.: US 9,589,037 B2
(45) Date of Patent: Mar. 7, 2017

(54) CONCEPTUAL SERVICES IMPLEMENTATION PLATFORM

(75) Inventors: Joe Robert Hill, Austin, TX (US); Steven H Marney, Lake Onon, MI (US); Michael Kavanagh Smith, Austin, TX (US); Sumit Bandyopadhyay, Sausalito, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/374,839

(22) PCT Filed: Mar. 29, 2012

(86) PCT No.: PCT/US2012/031046
§ 371 (c)(1),
(2), (4) Date: Jul. 25, 2014

(87) PCT Pub. No.: WO2013/147780
PCT Pub. Date: Oct. 3, 2013

(65) Prior Publication Data
US 2014/0344782 A1 Nov. 20, 2014

(51) Int. Cl.
*G06F 9/44* (2006.01)
*G06F 17/30* (2006.01)
(Continued)

(52) U.S. Cl.
CPC .......... *G06F 17/30557* (2013.01); *G06F 8/30* (2013.01); *G06F 8/40* (2013.01);
(Continued)

(58) Field of Classification Search
CPC ........ G06F 17/30563; G06F 17/30557; G06F 17/30864; G06F 9/546; G06F 8/10;
(Continued)

(56) References Cited

U.S. PATENT DOCUMENTS

| | | | |
|---|---|---|---|
| 6,604,110 B1 * | 8/2003 | Savage | G06F 17/30563 707/602 |
| 7,873,422 B2 | 1/2011 | Dumas et al. | |

(Continued)

FOREIGN PATENT DOCUMENTS

| | | |
|---|---|---|
| CN | 1532752 | 9/2004 |
| CN | 101859318 | 10/2010 |
| CN | 102377796 | 3/2012 |

OTHER PUBLICATIONS

Bhose, R. et al., "Integrating Composite Applications on the Cloud Using SCA", http://drdobbs.com/cpp/223800269, Mar. 15, 2010—8 pages.

(Continued)

*Primary Examiner* — Tuan Vu
(74) *Attorney, Agent, or Firm* — OGAWA Professional Corporation

(57) ABSTRACT

The present disclosure generally relates to computing methods and applications. A service platform includes standard functionalities that can be used in different applications, such as composite applications. The service platform includes a database that stores application specific information, which is mapped to the standard functionalities. To use these functionalities, different applications initialize relevant parts of the database and use predefined standards to access these functionalities.

11 Claims, 18 Drawing Sheets

(51) Int. Cl.
*G06F 9/45* (2006.01)
*G06F 9/50* (2006.01)
*G06F 17/50* (2006.01)

(52) U.S. Cl.
CPC .............. *G06F 8/71* (2013.01); *G06F 9/5072* (2013.01); *G06F 17/50* (2013.01)

(58) Field of Classification Search
CPC .......... G06F 8/34; G06F 8/35; G06F 17/3056; G06Q 10/00; G06Q 10/06; G06Q 10/10; G06Q 10/06313; H04L 67/16; H04L 41/0226
See application file for complete search history.

(56) References Cited

U.S. PATENT DOCUMENTS

| | | | |
|---|---|---|---|
| 2004/0205758 A1 | 10/2004 | Hikawa et al. | |
| 2005/0015619 A1* | 1/2005 | Lee | G06Q 10/10 726/4 |
| 2006/0010195 A1* | 1/2006 | Mamou | G06Q 10/10 709/203 |
| 2006/0259604 A1* | 11/2006 | Kotchavi | H04L 41/0226 709/223 |
| 2007/0011126 A1* | 1/2007 | Conner | G06Q 10/00 706/47 |
| 2007/0300242 A1* | 12/2007 | Boyd | G06F 9/546 719/330 |
| 2008/0120129 A1* | 5/2008 | Seubert | G06Q 10/06 705/35 |
| 2008/0294712 A1* | 11/2008 | Lu | H04L 67/16 709/202 |
| 2009/0158237 A1 | 6/2009 | Zhang et al. | |
| 2010/0042641 A1* | 2/2010 | Kamalakantha | G06F 17/30557 707/805 |
| 2010/0064275 A1 | 3/2010 | Akkiraju et al. | |
| 2010/0077386 A1 | 3/2010 | Akkiraju et al. | |
| 2010/0088662 A1 | 4/2010 | Tung et al. | |
| 2010/0094913 A1* | 4/2010 | Connor | G06F 17/30864 707/803 |
| 2010/0153865 A1 | 6/2010 | Barnes et al. | |
| 2010/0194913 A1 | 8/2010 | Sato | |
| 2011/0119649 A1 | 5/2011 | Kand et al. | |
| 2011/0296419 A1 | 12/2011 | Dumas et al. | |
| 2011/0307289 A1* | 12/2011 | Hosur | G06Q 10/06313 705/7.23 |
| 2012/0036252 A1 | 2/2012 | Shi et al. | |
| 2012/0185821 A1* | 7/2012 | Yaseen | G06F 8/10 717/105 |

OTHER PUBLICATIONS

PCT Search Report/Written Opinion—Application No. PCT/US2012/031046—Dated Nov. 29, 2012—10 pages.
European Patent Office, "Extended European Search Report," issued in European Patent App. No. 12872632, dated Apr. 7, 2016, 9 pages.
European Patent Office, "Invitation pursuant to Rule 62a(1) EPC," issued in European Patent App. No. 12872632, dated Nov. 11, 2015, 2 pages.
International Searching Authority, "International Preliminary Report on Patentability," Oct. 9, 2014, issued in International Patent App. No. PCT/US2012/031046.
Gregor Hohpe et al., "Introduction," Enterprise Integration Patterns, (webpage), Mar. 2, 2012, <http://web.archive.org/web/20120302121449/http://enterpriseintegrationpatterns.com/Introduction.html>, 9 pages.
Gregor Hohpe et al., "Message Router," Mar. 2, 2012, <http://web.archive.org/web/20120302121351/http://enterpriseintegrationpatterns.com/MessageRouter.html>, 1 page.
Gregor Hohpe et al., "Publish-Subscribe Channel," Mar. 2, 2012, <http://web.archive.org/web/20120302140317/http://enterpriseintegrationpatterns.com/PublishSubscribeChannel.html>, 1 page.
Gregor Hohpe, "Enterprise Integration Patterns: Asynchronous Messaging Architectures in Practice," 2003, JAOO Conference 2003, <http://web.archive.org/web/20120208061656/http://enterpriseintegrationpatterns.com/docs/jaoo_hohpeg_enterpriseintegrationpatterns.pdf>, 32 pages.
Gregor Hohpe, "Patterns and Best Practices for Enterprise Integration," Feb. 26, 2012, (webpage), <http://web.archive.org/web/20120226174434/http://www.enterpriseintegrationpatterns.com/>, 3 pages.
Hohpe et al., "Solving Integration Problems using Patterns," Mar. 2, 2012, <http://web.archive.org/web/20120302122450/http://enterpriseintegrationpatterns.com/Chapter1.html>, 18 pages.
The Apache Software Foundation, "Enterprise Integration Patterns," Feb 10, 2012, (webpage), <http://web.archive.org/web/20120210020927/http://camel.apache.org/enterprise-integration-patterns.html>, 4 pages.
Wikipedia, "Enterprise application integration," Feb. 12, 2012, <https://en.wikipedia.org/w/index.php?title=Enterprise_application_integration&oldid=478112581>, 7 pages.

* cited by examiner

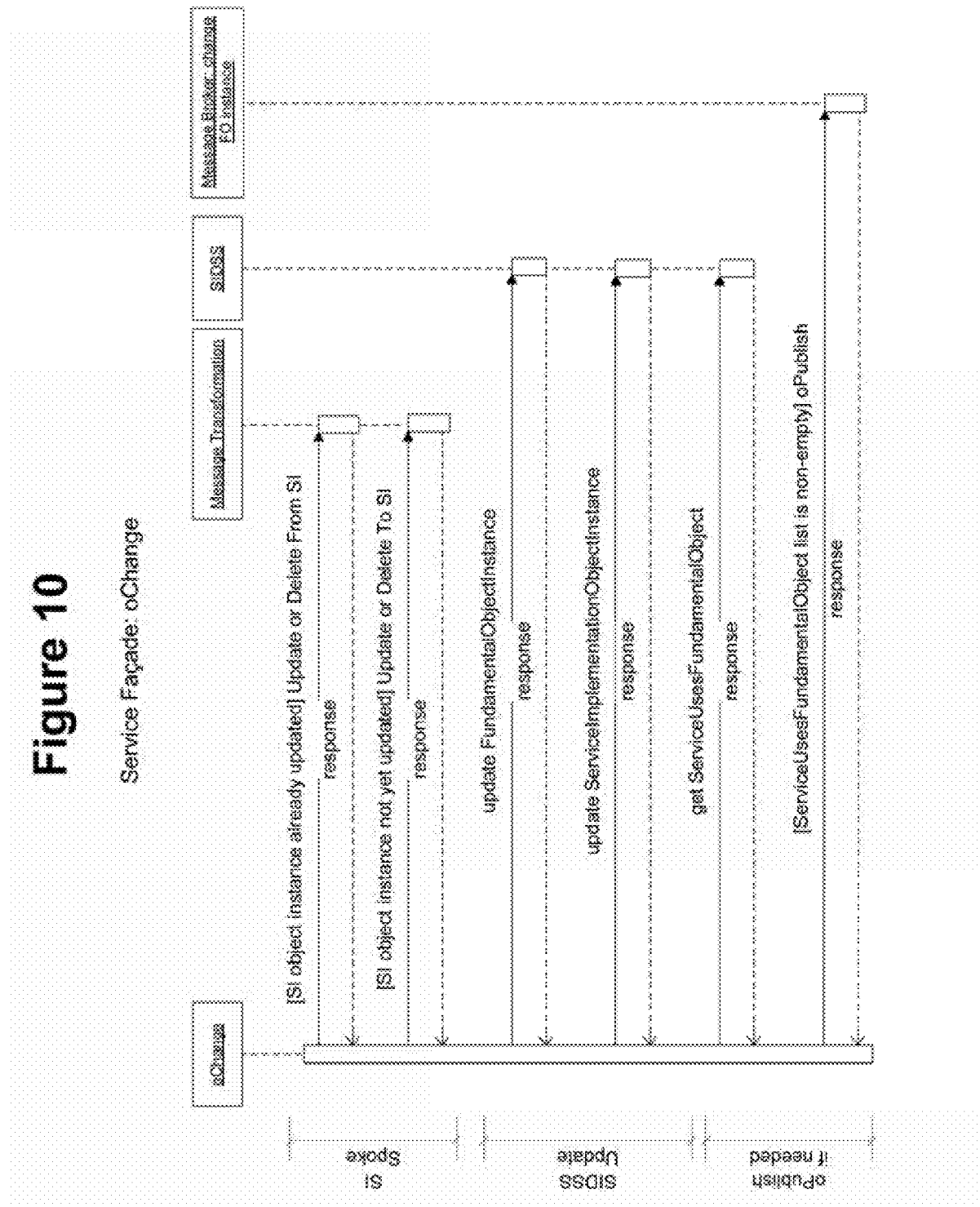

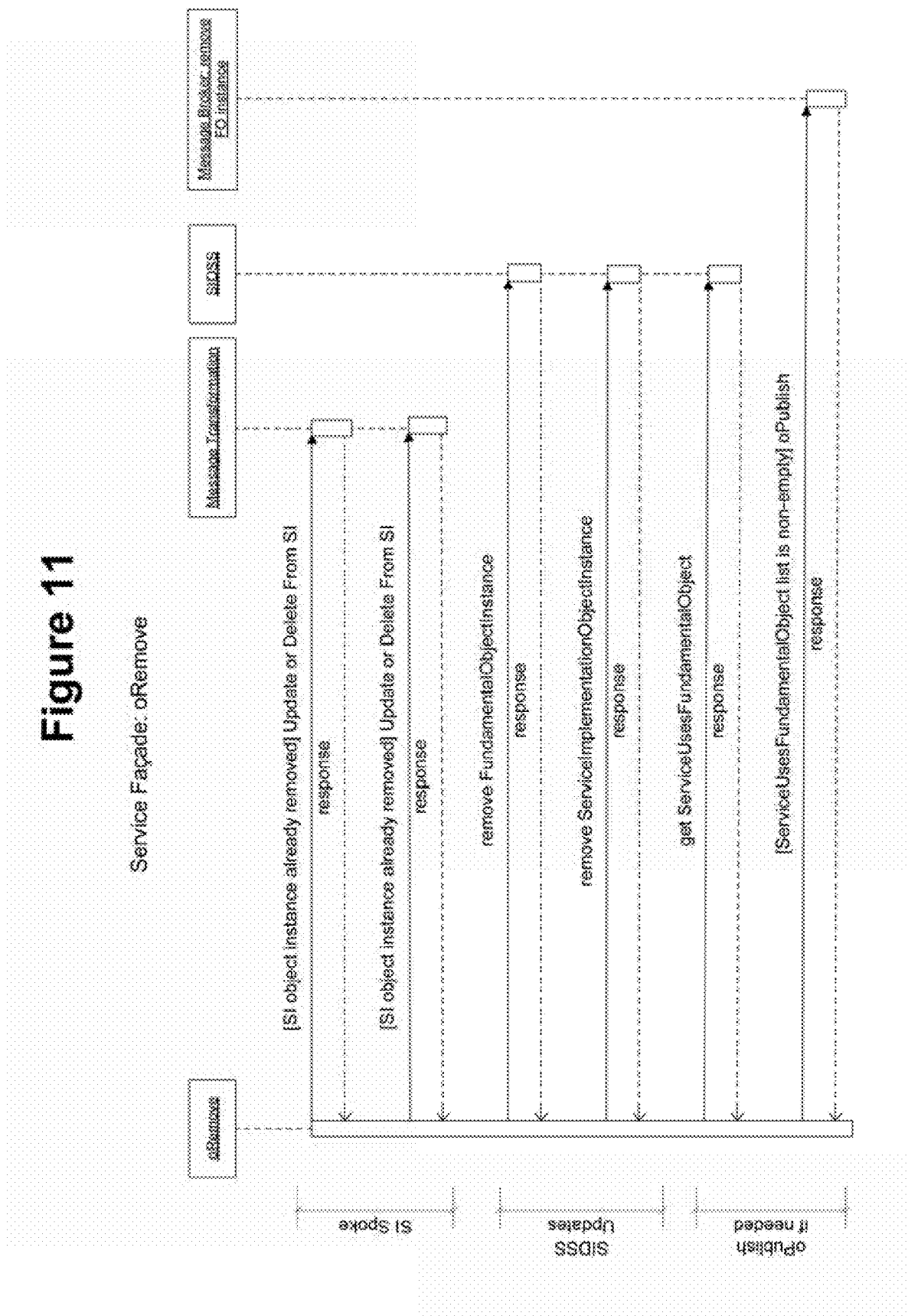

CONCEPTUAL SERVICES IMPLEMENTATION PLATFORM

BACKGROUND

The present disclosure generally relates to computing methods and applications.

With the advent of the computer and network technologies, more and more software tools and applications become available to provide solutions to individuals and business entities. Often, programmers build software applications by combining existing software solutions and functions, usually for the reasons of cost savings. As an example, an application that is formed by combining multiple existing service implementations can be loosely referred to as a composite application. This type of application can be referred to by other names as well. Usually, a composite application comprises functionalities from more than one source and a logic portion that governs how these functionalities are used and interact with one another.

BRIEF DESCRIPTION OF THE DRAWINGS

FIG. 10 is a simplified sequence diagram for Service Façade operation oChange.

FIG. 11 is a simplified sequence diagram for the Service Façade operation oRemove.

DETAILED DESCRIPTION

Figure 1:
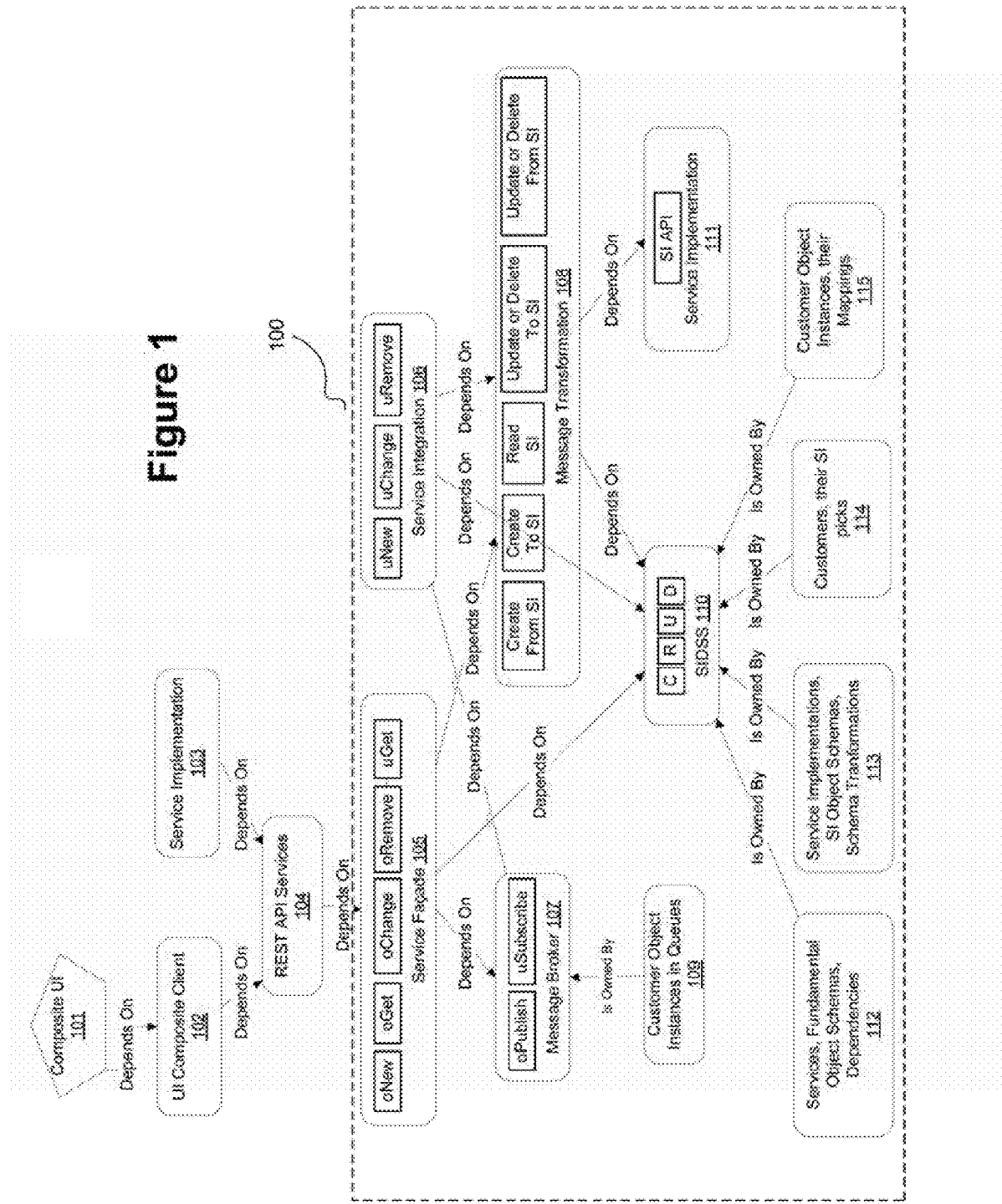
FIG. 1 is a simplified diagram illustrating a conceptual services implementation platform (CSIP) within the context of a composite application platform.

The present disclosure generally relates to computing methods and applications. A service platform includes standard operations that can be used to implement composite applications. The service platform includes a database that stores information on conceptual services and service implementations; each conceptual service can have a plurality of service implementations. The service platform automatically sends standard operation service requests to appropriate service implementations; the appropriate service implementation for a request may be determined by the customer who is making the request. Some service requests trigger additional requests, which the platform handles automatically.

Existing technologies are often inadequate for various reasons. Typically, for composite applications, existing solutions typically provide design patterns and generic integration platforms. Problems with these solutions include: (i) they enable developers to create solutions that do not conform to the best patterns (e.g., lack of abstract canonical service interfaces and over-reliance on point-to-point integration); (ii) they do not follow the principles of model driven architecture, but instead require developers to construct platform-specific implementation code for each platform separately; (iii) they require system engineers to create domain solutions, instead of enabling domain experts to specify domain designs that are directly executable; (iv) the existing published design patterns are at a much finer grained level than is needed, in other words, they are elementary building blocks rather than high-level meta-patterns that are needed for multi-tenant, configurable, composite services; and (v) these other solutions do not address the traceability issues from the business context to the conceptual services to the logical designs to the physical technologies to the executable code.

Typically, composite applications are built by combining functionalities from multiple applications, services, and/or sources. By using functionalities that are already available, it is possible to build composite applications faster than starting from scratch. However, the complexity of composite applications, especially when delivered as multi-tenant configurable services, creates obstacles to success at every stage of the lifecycle; conception, design, development, deployment, operation, and continuous release. Some of this complexity is inherent to the problem being solved, but much of it is artificially introduced by failing to treat composite applications as the new solution type they are.

In general, composite applications are complex. They combine cross-functional, role-based user experiences, case- and message-based workflows, interoperable canonical business services (each delivered via multiple optional service implementations), multi-tenant customer configurations, together with security, logging, monitoring, self-service sales, metering, billing, etc. Each of these components is a challenge in itself, but is still much simpler than their combination. Further, composite applications often require formal traceability from the business context to the conceptual services to the logical designs to the physical technologies to the executable code, which are not dealt with coherently by existing application methodologies.

These challenges have resulted in multiple failures in the development projects, customer contracts, and service line offerings and portfolios. The difficulties negatively affect code quality, time to market, development and maintenance costs, and agile rapid release. In addition, the avoidable complexities often cause software engineers to forget to follow good design principles based on model driven architecture, including standardized domain-independent platform architectures and platform-independent portable domain designs.

It is to be appreciated that, in contrast, by focusing on the specific problems associated with composite applications and by leveraging our Role-based Domain Architecture (RDA) methodology and tools, we have developed a design methodology that reduces the avoidable complexity in these solutions. As described in the present disclosure, we have defined a domain-independent composite application platform, appropriate RDA meta-models for capturing platform-independent domain models, and the code- and configuration-generating drivers that make executable designs a reality for composite applications. The present disclosure describes a portion of the platform that provides managing multiple implementations of conceptual services and their dependencies. It is to be appreciated the methods and systems described in the present disclosure are comparable to that of a relational database management system, which can be combined with a database design tool for composite, service-oriented, message-based, event-driven, multi-tenant, as-a-service software, the resulting designs being used to generate configuration files and patterned code that is deployable on the runtime platform. The methods and systems described in the present disclosure focus on one sub-problem of this big picture, the problem of managing multiple implementations for conceptual services and their dependencies within a configurable and multi-tenant environment.

FIG. 1 is a simplified diagram illustrating a conceptual services implementation platform (CSIP) within the context of a composite application platform. This diagram is merely an example, which should not unduly limit the scope of the claims herein. One of ordinary skill in the art would recognize other variations, modifications, and alternatives. The CSIP 100 comprises the following service components ("SI" stands for "Service Implementation" and prefixes "o-" and "u-" indicate "owning" and "using" services, respectively): Service Façade 105, Service Integration 106, Message Broker 107, Message Transformation 108, SIDSS 110, and SI API 111. Depending on the implementations, these service components can be modified, replaced, and/or combined. It is to be understood that the service components may be referred to using other terms. As an example, the CSIP 100 can be implemented using one or more computer systems and/or a service orientated architecture. Various components of the CSIP 100 can be implemented as software modules stores on computer readable mediums and executed by processors. Depending on the application, one or more components of the CSIP 100 may be added, removed, modified, and/or replaced.

To use the CSIP 100, a user interfaces with the service façade 105 of the CSIP 100. As shown in FIG. 1, the REST API services 104 depends on the Service Façade 105, which provides standard functions that REST API Services 104 can access. The REST API Services 104 provides an interface for the UI Composite Client 102 and the Service Implementation 103. For example, UI Composite Client 102 can be a composite application that uses multiple standard operations provided by the CSIP 100, and to access these operations, the composite application uses the REST API services 104 which interact with the Service Façade 105.

The Service Integration and Dependency Support System (SIDSS) 110 performs various operations and owns fundamental objects (a) Services, Fundamental Object Schemas, Service Dependencies 112; (b) Service Implementations, SI Object Schemas, Schema Transformations 113; (c) Customers and their SI Picks 114; (d) Customer Object Instances and their Mappings 115. The SIDSS 110 exposes these fundamental objects through standard CRUD (Create, Retrieve, Update, Delete) operations.

The Message Broken 107 owns fundamental object Customer Object Instances in Queues. In addition, the Message Broker 107 exposes operator oPublish and uSubscribe.

The Message Transformation 108, as shown, exposes operations Create from SI, Create To SI, Read SI, Update or Delete from SI, and Update or Delete To SI. These operations are described below and illustrated in FIGS. 3-8.

The Service Façade 105 exposes operations oNew, oChange, oRemove, oGet, and uGet. In addition, the Service Façade 105 interfaces with the REST API Services 104. for example, upon receiving a service request from the REST API Services 104, the Service Façade 105 executes the appropriate CSIP operations to satisfy the service request.

The Service Integration 106 exposes operations uNew, uChange, and uRemove.

The components of the CSIP 100 work with and depend on one another. These services have the following dependencies as illustrated in FIG. 1:

Service Façade 105 depends on (a) SIDSS 110; (b) Message Broker 107: oPublish; and (c) Message Transformation 108.

Service Integration 106 depends on (a) SIDSS 110; (b) Message Broker 107: uSubscribe; and (c) Message Transformation 108.

Message Broker 107 depends on SIDSS 110.

Message Transformation 108 depends on (a) SIDSS 110 and (b) (called) Service Implementation 111.

For example, to access and use the CSIP 100, a composite application UI Composite Client 102 or (calling) Service Implementation 103 depends on REST API Services 104, which depends on Service Façade 105. And to access the (called) Service Implementation 111, the composite application interacts with the CSIP 100 through REST API Services 104, which depends on Service Façade 105, which depends on Service Transformation 108, which depends on Service Implementation 111.

As can be seen from FIG. 1 and the description above, many components of the CSIP 100 depend on the SIDSS 110. It is to be appreciated that the SIDSS 110 provides dependency supports that allow functionalities of CSID 100 components to operate with one another and provide services to composite applications.

Figure 2:
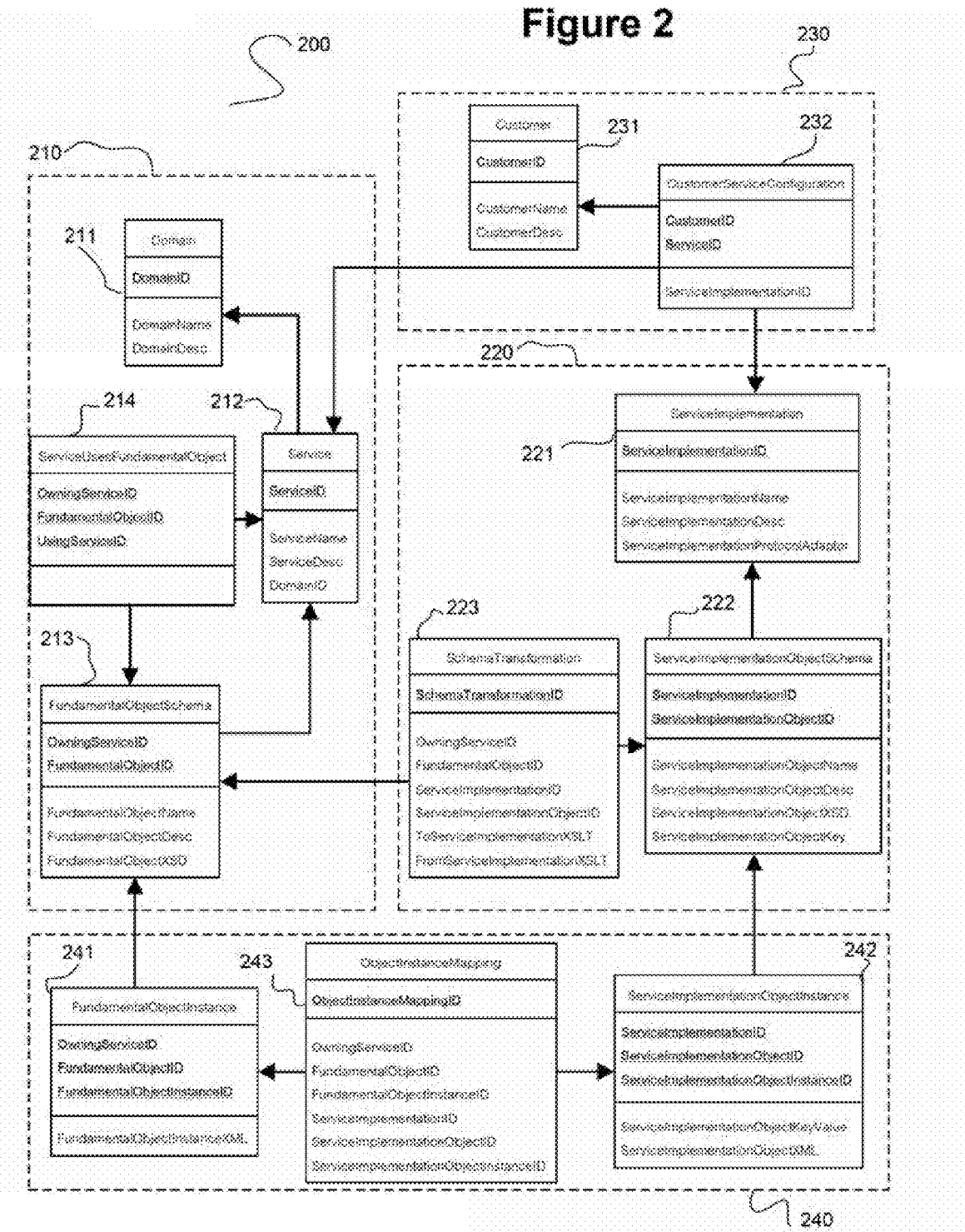
FIG. 2 is a simplified diagram illustrating entities and their relationships for service implementation and dependency support system (SIDSS).

FIG. 2 is a simplified diagram illustrating entities and their relationships for the Service Implementation and Dependency Support System (SIDSS). This diagram is merely an example, which should not unduly limit the scope of the claims herein. One of ordinary skill in the art would recognize other variations, modifications, and alternatives. The SIDSS 200 uses SIDSS tables to store the data needed by SIDSS to perform its responsibilities to support various components of the CSIP, including Service Façade, Service Integration, Message Broker, and Message Transformation. The SIDSS 200 provides standard CRUD (Create, Retrieve, Update, Delete) operations for each of the tables in the diagram. As an example, the SIDSS 200 can be implemented using one or more network database systems or services to store the SIDSS tables. For example, each of these tables can be implemented as a database or a record entry at a database.

The SIDSS database 200 includes domain information 210, service implementation information 220, customer information 230, and operational information 240. Domain information 210 includes Domain table 211, Service table 212, FundamentalObjectSchema table 213, and ServiceUsesFundamentalObject table 214. Service implementation information 220 includes ServiceImplementation table 221, ServiceImplementationObject Schema table 222, and SchemaTransformation table 223. Customer information 230 includes Customer table 231 and CustomerServiceConfiguration table 232. Operational information 240 includes FundamentalObjectInstance table 241, ServiceImplementationObjectInstance table 242, and ObjectInstanceMapping table 243.

The business data in the domain is represented as a set of fundamental objects stored in the FundamentalObjectSchema table 213, each of which is owned by one of the services in Service table 212. These fundamental object schemas are listed in FundamentalObjectSchema table 213, which identifies the OwningService for each object. A fundamental object owned by one service may be used by other services, each of which is referred to as a UsingService. ServiceUsesFundamentalObject table 214 stores this information (i.e., relationships between services and various fundamental objects that they use). As an example, the structure of a fundamental object is represented as an XML Schema Design (XSD) which is stored in the FundamentalObjectXSD attribute of FundamentalObjectSchema table 213. Instances of a fundamental object are represented as XML documents stored in the FundamentalObjectInstanceXML attribute of FundamentalObjectInstance table 241. These XML documents conform to the corresponding FundamentalObjectXSD.

The ServiceImplementation table 221 stores information on the service implementations that implement the (conceptual) services. A Service Implementation (SI) that implements an OwningService is the system of record for the instances of fundamental objects owned by that OwningService.

The Customer table 231 stores information on the customers of the services. The CustomerServiceConfiguration table 232 stores the configuration details for each customer; this table has a row for each (Service, Customer) pair, in which ServiceImplementationID identifies the ServiceImplementation that this customer has picked to implement this Service. Rows are inserted into these tables whenever a new customer is introduced. The CustomerServiceConfiguration table 232 provides links between services stored in the Service table 212 and implementations of services stored in the ServiceImplementation table 221. When the user (or the composite application of the user) needs to use a service provided by the CSIP and sends a service request, the SIDSS 200 refers to various tables to determine which services to use and how these services are implemented.

The service implementation information tables 220 on the right parallel the domain information tables 210 on the left. For example, alignment between the Service Implementation Objects and the corresponding Fundamental Objects is made explicit in the SchemaTransformation table 223 in the middle. For example, the SchemaTransformation table 223 stores the XSLT files needed to translate between corresponding FundamentalObjectInstanceXML and ServiceImplementationObjectInstanceXML documents. These transformations may also include data domain mappings (e.g., "Texas" in one representation might be "TX" in another; truncation and padding functions; etc.).

New rows are inserted into the ServiceImplementation table 221, ServiceImplementationObject Schema table 222, and SchemaTransformation table 223 whenever a new service implementation is introduced. The new service implementation can be a part of the CSIP functionalities and/or introduced by a customer.

Operation tables 240 include FundamentalObjectInstance table 241, ServiceImplementationObjectInstance table 242, and the ObjectInstanceMapping table 243. Object mappings between FundamentalObjectInstance table 241 and ServiceImplementationObjectInstance table 242 are stored in the ObjectInstanceMapping table 243.

New rows are inserted into the FundamentalObjectInstance table 241, ServiceImplementationObjectInstance table 242, and ObjectInstanceMapping table 243 when new instances occur in the execution of the composite application.

It is to be understood that while the tables illustrated in FIG. 2 are referred to with specific names, other names can be used as well. Depending on the application, one or more tables in FIG. 2 can be added, removed, renamed, modified, replaced, and/or combined.

Now referring back to FIG. 1. As shown in FIG. 1, the CSIP 100 includes Message Broker 107, which is a component responsible for standard publish-subscribe operations.

FIGS. 3-8 are sequence diagrams for operations performed by Message Transformation 108. Among other things, these figures provide details of Message Transformation operations and their dependencies on SIDSS 110 and Service Implementation 111. While operations illustrated in FIGS. 3-8 are referred to with specific terms, it is to be understood that these operations and their variations can be referred to using other terms, and they should not unduly limit the claims.

Figure 3:
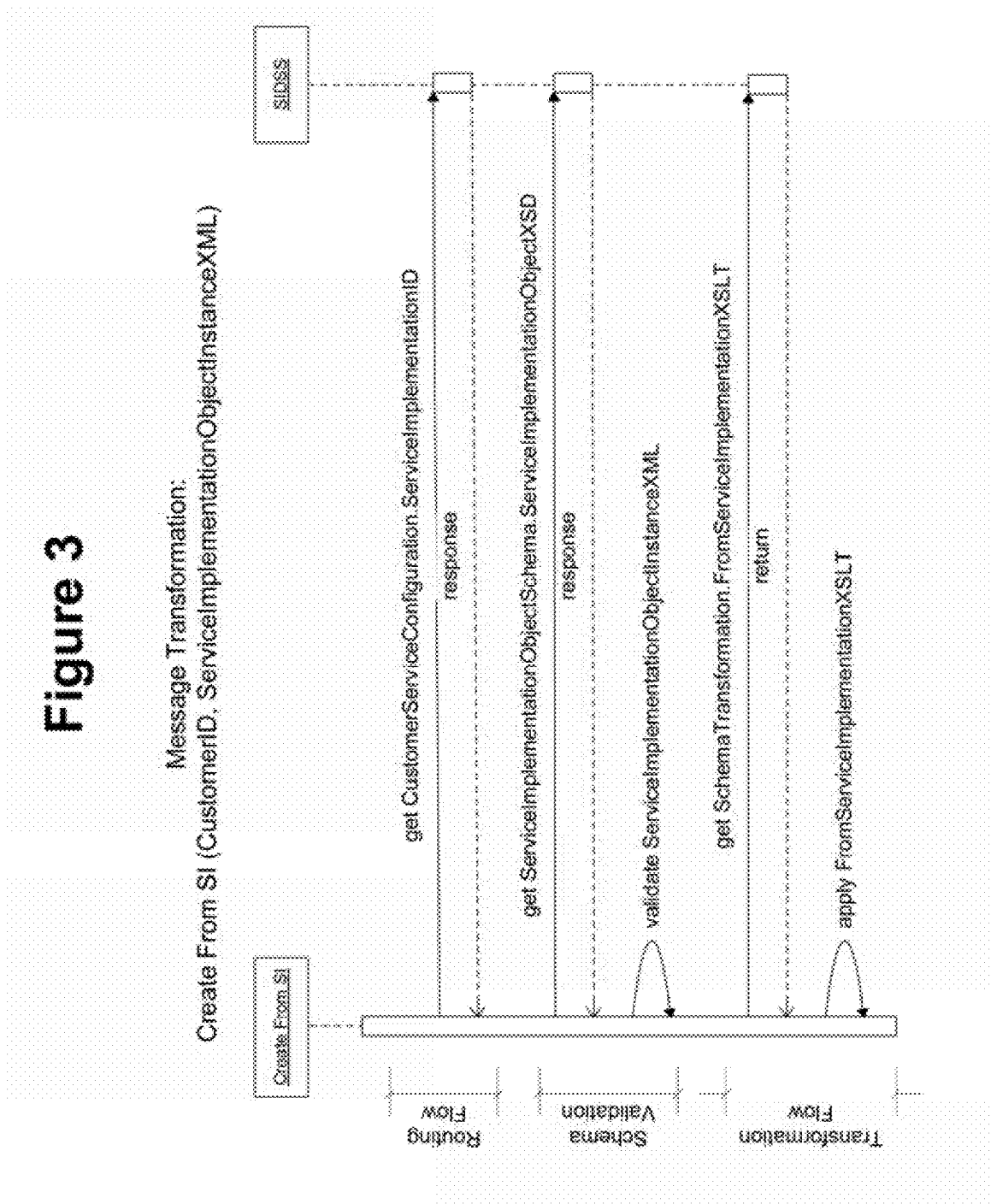
FIG. 3 is a simplified sequence diagram for Message Transformation operation Create From SI (Service Implementation).

FIG. 3 is a simplified sequence diagram for Message Transformation operation Create From SI. This diagram is merely an example, which should not unduly limit the scope of the claims herein. One of ordinary skill in the art would recognize other variations, modifications, and alternatives. For example, one or more processes performed in FIG. 3 can be added, removed, modified, replaced, rearranged, repeated, and/or overlapped. As shown in FIG. 3, the operation Message Transformation: Create From SI includes three steps: (i) routing flow, which obtains the ServiceImplementationID information from the Customer Service Configuration table (e.g., element 232 in FIG. 2) for this Customer and Service from the SIDSS; (ii) schema validation, which obtains ServiceImplementationObjectXSD information from the SIDSS and uses it to check the ServiceImplementationObjectInstanceXML document; and (iii) transformation flow, which obtains and applies FromServiceImplementationXSLT from the SIDSS to form the corresponding FundamentalObjectInstanceXML document.

Figure 4:
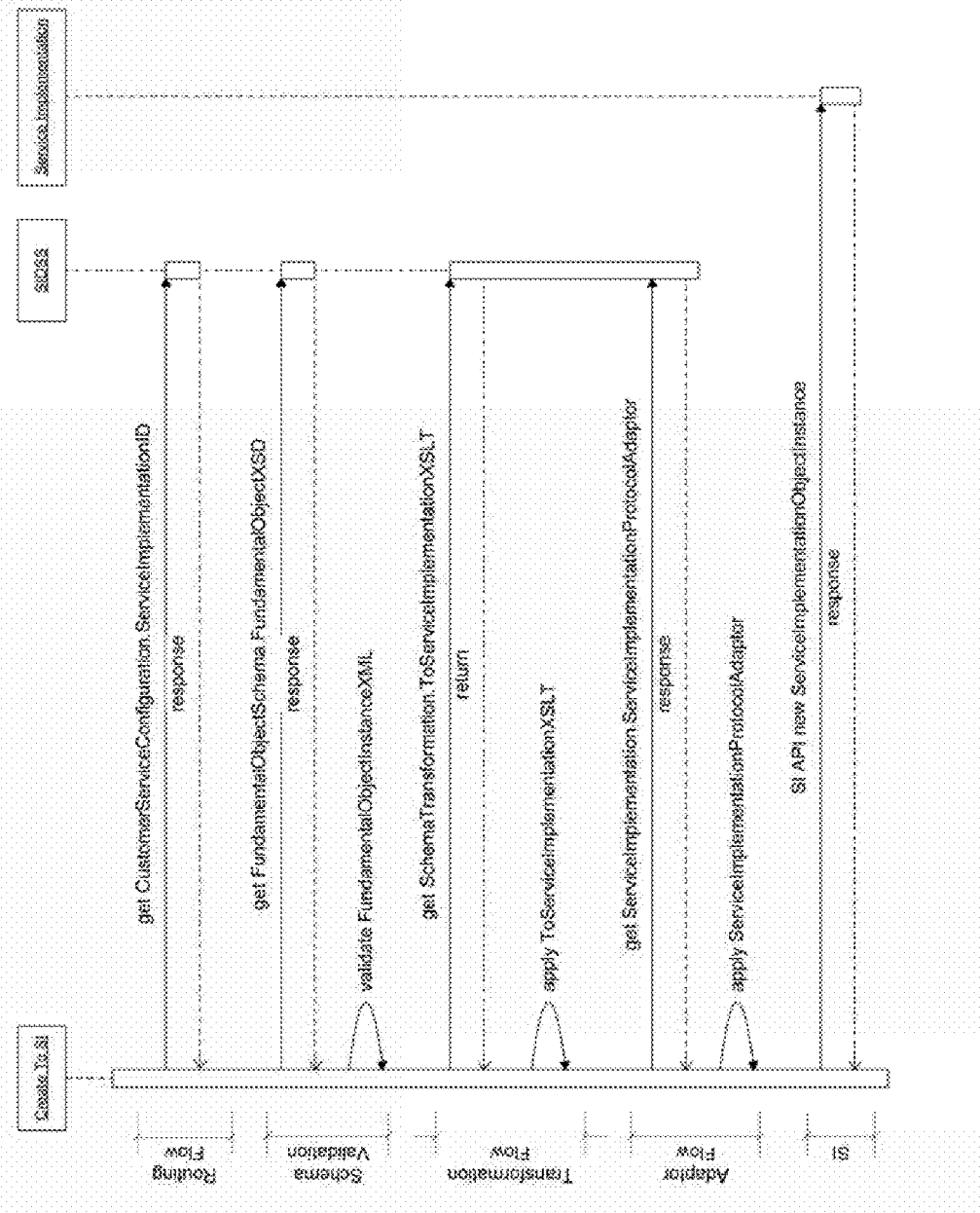
FIG. 4 is a simplified sequence diagram for Message Transformation operation Create To SI.

FIG. 4 is a simplified sequence diagram for Message Transformation operation Create To SI. This diagram is merely an example, which should not unduly limit the scope of the claims herein. One of ordinary skill in the art would recognize other variations, modifications, and alternatives. For example, one or more processes performed in FIG. 4 can be added, removed, modified, replaced, rearranged, repeated, and/or overlapped. As shown in FIG. 4, the operation Message Transformation: Create To SI has five steps: (i) routing flow from the SIDSS; (ii) schema validation, which gets FundamentalObjectXSD from the SIDSS and uses it to check the FundamentalObjectInstance XML document; (iii) transformation flow, which obtains and applies ToServiceImplementationXSLT to form the corresponding ServiceImplementationObjectInstanceXML document; (iv) adaptor flow, which obtains and applies ServiceImplementationProtocolAdaptor; and (v) Service Implementation API call, which creates the new instance in the Service Implementation (e.g., SI API 111 in FIG. 1).

Figure 5:
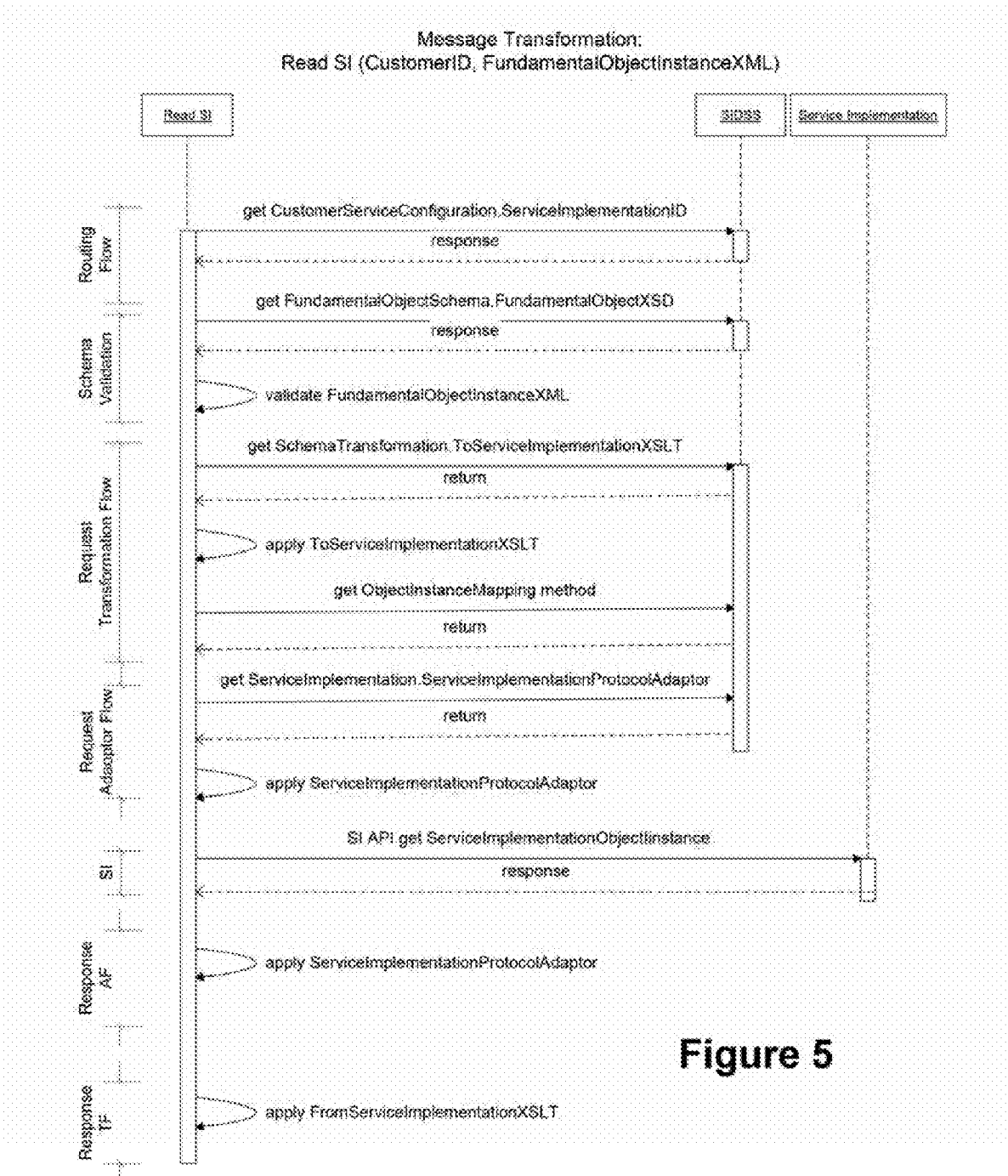
FIG. 5 is a simplified sequence diagram for Message Transformation operation Read SI.

FIG. 5 is a simplified sequence diagram for Message Transformation operation Read SI. This diagram is merely an example, which should not unduly limit the scope of the claims herein. One of ordinary skill in the art would recognize other variations, modifications, and alternatives. For example, one or more processes performed in FIG. 5 can be added, removed, modified, replaced, rearranged, repeated, and/or overlapped. As shown in FIG. 5, to provide a service implementation, certain information is obtained from the SIDSS and processed, based on which service is processed by the service implementation component of the CSIP.

Figure 6:
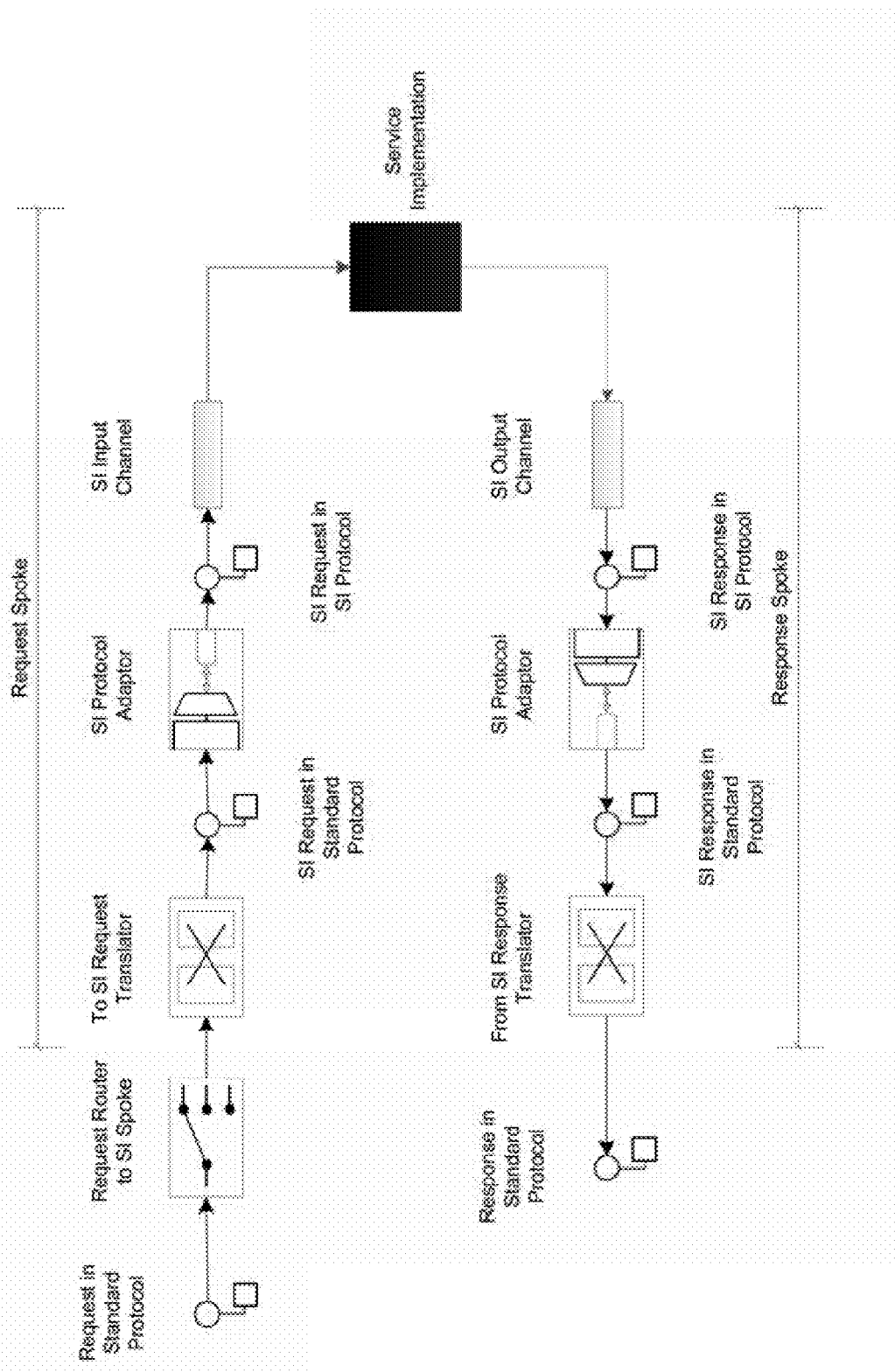
FIG. 6 is a simplified diagram illustrating an enterprise integration patterns representation for Message Transformation Read SI.

FIG. 6 is a simplified diagram illustrating the Message Transformation Read SI operation using enterprise integration patterns. This diagram is merely an example, which should not unduly limit the scope of the claims herein. One of ordinary skill in the art would recognize other variations, modifications, and alternatives. For example, one or more processes or modules can be added, removed, modified, replaced, rearranged, repeated, and/or overlapped. As shown in FIG. 6, a request is provided in standard protocol. After processed by various modules of the CSIP as a part of the "Request Spoke", the Service Implementation module performs the requested service, and the "Response Spoke" provides a response in Standard Protocol. It is to be appreciated that the CSIP modules are standard modules that provide functionalities that can be used by composite applications. To use these modules and functionalities, a user does not have to make customized modules for the composite application; instead, the user simply uses standard inputs to use these modules. In contrast, existing methods typically require users to customize these modules before utilizing them in a composite application, thereby often causing integration problems.

Figure 7:
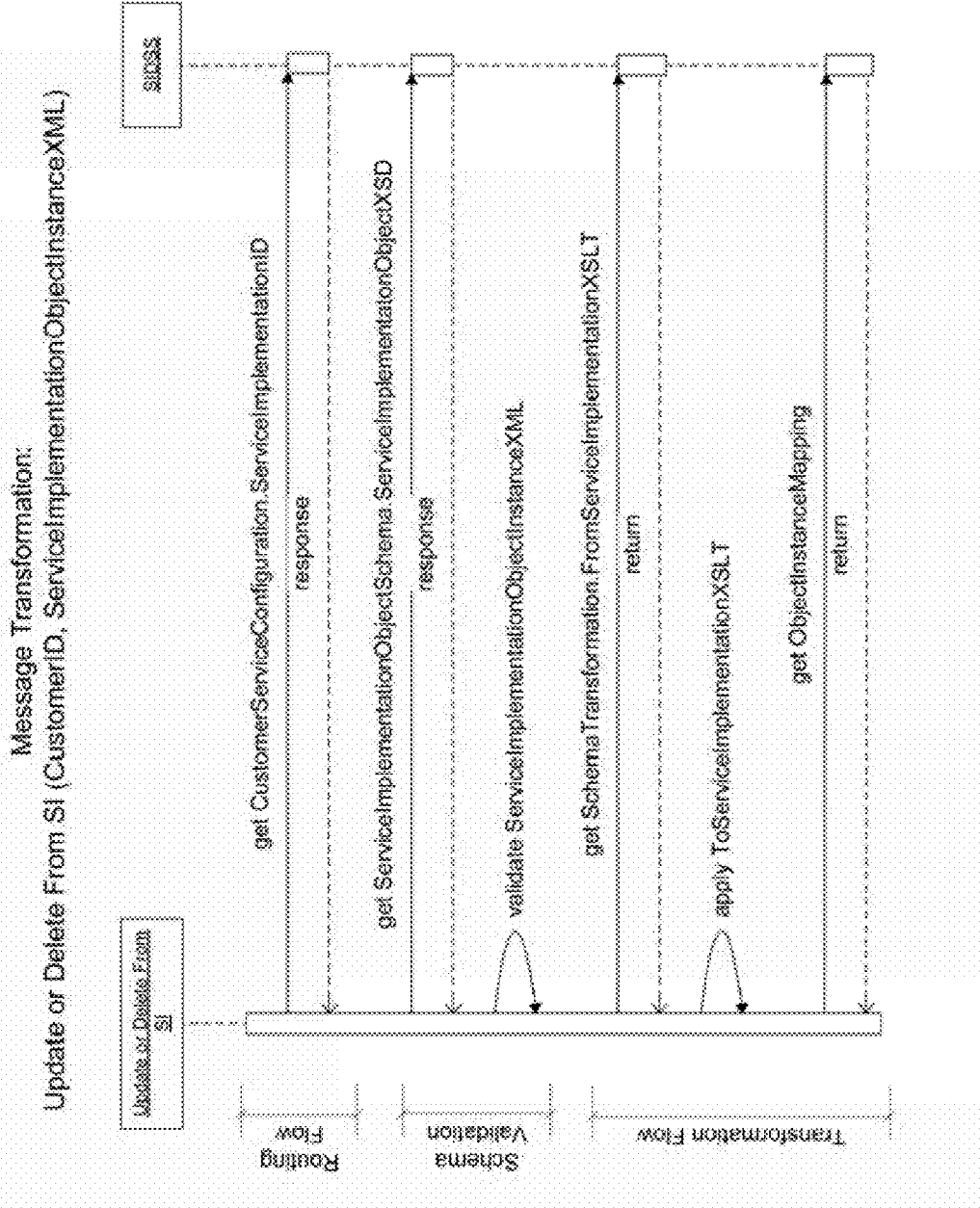
FIG. 7 is a simplified sequence diagram for Message Transformation operation Update or Delete From SI.
Figure 8:
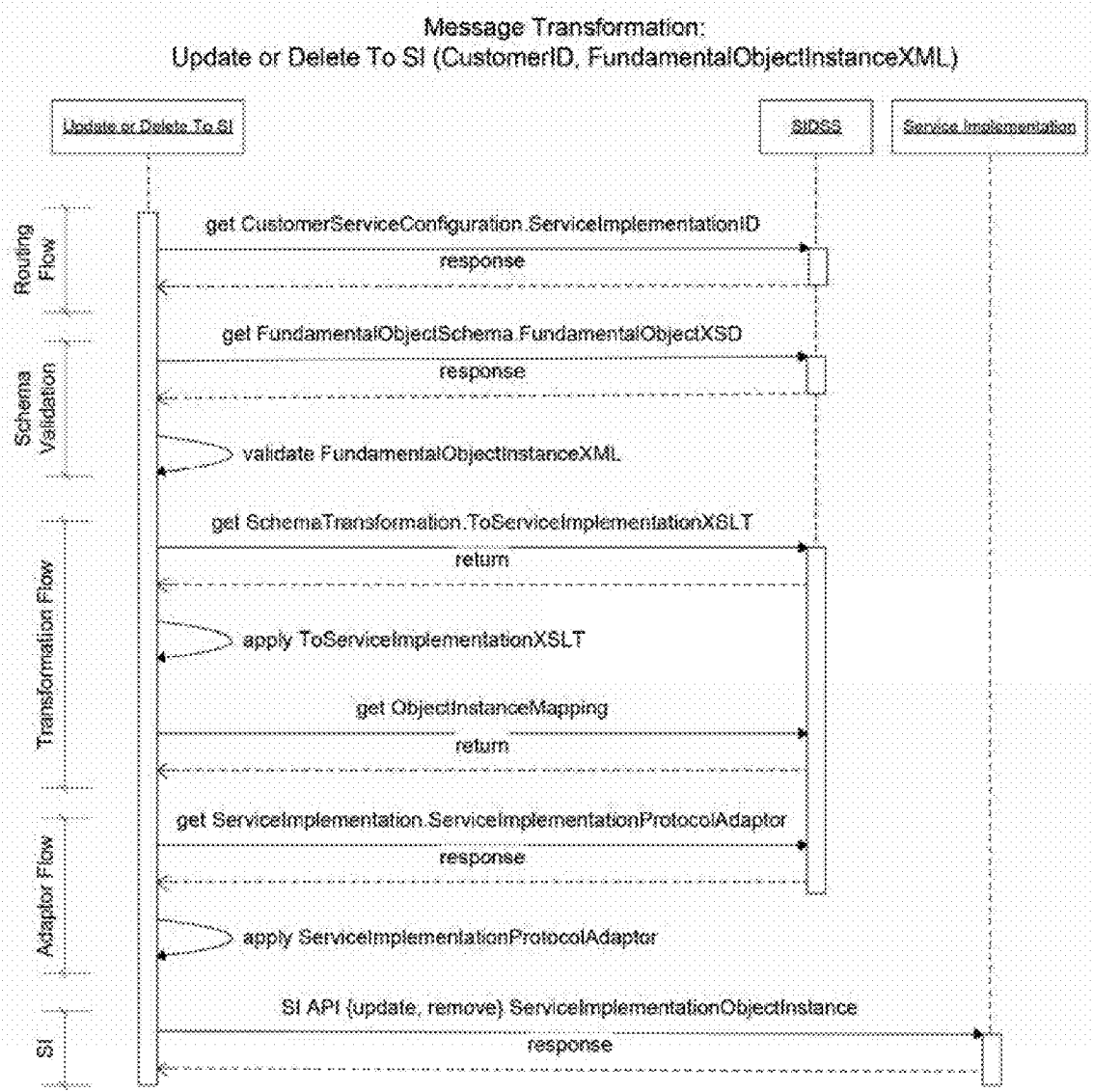
FIG. 8 is a simplified sequence diagram for Message Transformation operation Update or Delete From SI.

FIGS. 7 and 8 are simplified sequence diagrams for operations performed by the Message Transformation component 108 of the CSIP 100. FIG. 7 is a simplified sequence diagram for Message Transformation operation Update or Delete From SI. This diagram is merely an example, which should not unduly limit the scope of the claims herein. One of ordinary skill in the art would recognize other variations, modifications, and alternatives. For example, one or more processes performed in FIG. 7 can be added, removed, modified, replaced, rearranged, repeated, and/or overlapped. As shown in FIG. 7, update or delete from SI functions are performed in conjunction with the SIDSS.

FIG. 8 is a simplified sequence diagram for Message Transformation operation Update or Delete To SI. This diagram is merely an example, which should not unduly limit the scope of the claims herein. One of ordinary skill in the art would recognize other variations, modifications, and alternatives. For example, one or more processes performed in FIG. 8 can be added, removed, modified, replaced, rearranged, repeated, and/or overlapped. As shown in FIG. 8, update or delete to SI functions are performed in conjunction with the SIDSS and the service implementation component. For example, after needed information is obtained from the SIDSS, the service implementation is carried out by the service implementation component.

Figure 9:
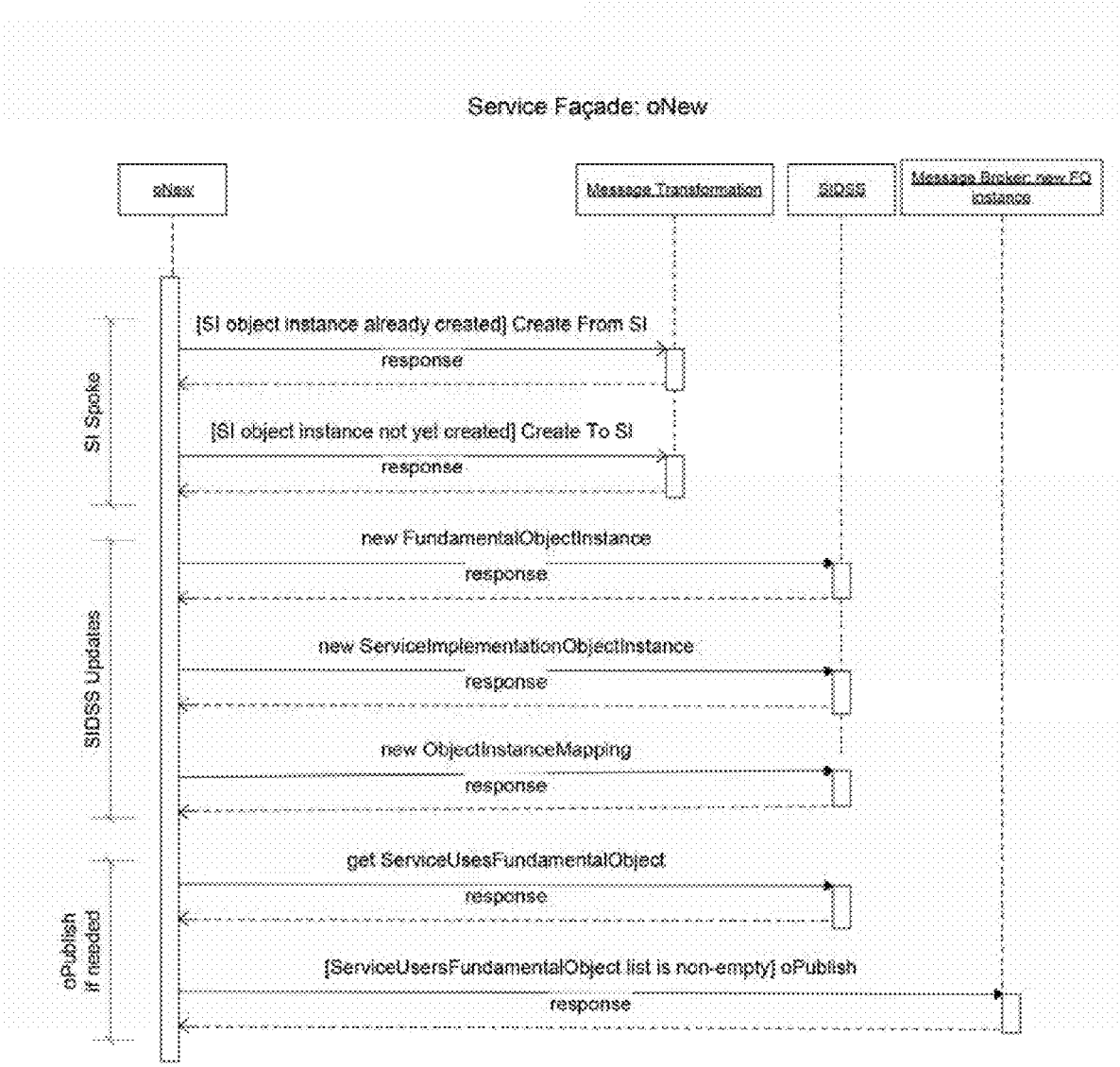
FIG. 9 is a simplified sequence diagram for Service Façade operation oNew.

FIGS. 9-12 are sequence diagrams for the operations performed by the Service Façade 105 component of the CSIP 100. While operations illustrated in FIGS. 9-12 are referred to with specific terms, it is to be understood that these operations and their variations can be referred to using other terms, and they should not unduly limit the claims. FIG. 9 is a simplified sequence diagram for Service Façade operation oNew. This diagram is merely an example, which should not unduly limit the scope of the claims herein. One of ordinary skill in the art would recognize other variations, modifications, and alternatives. For example, one or more processes performed in FIG. 9 can be added, removed, modified, replaced, rearranged, repeated, and/or overlapped. As shown in FIG. 9, the oNew operation is performed with Message Transformation 108, SIDSS 110, and Message Broker 107 components of the CSIP 100. Among others, the Message Broke 107 performs an oPublish of the new fundamental object instance.

FIG. 10 is a simplified sequence diagram for Service Façade operation oChange. This diagram is merely an example, which should not unduly limit the scope of the claims herein. One of ordinary skill in the art would recognize other variations, modifications, and alternatives. For example, one or more processes performed in FIG. 10 can be added, removed, modified, replaced, rearranged, repeated, and/or overlapped. As shown in FIG. 10, the oChange operation is performed with the Message Transformation 108, the SIDSS 110, and the Message Broker 107 components of the CSIP 100. Among others, the Message Broker 107 performs an oPublish of the change to the fundamental object instance.

FIG. 11 is a simplified sequence diagram for Service Façade operation oRemove. This diagram is merely an example, which should not unduly limit the scope of the claims herein. One of ordinary skill in the art would recognize other variations, modifications, and alternatives. For example, one or more processes performed in FIG. 11 can be added, removed, modified, replaced, rearranged, repeated, and/or overlapped. As shown in FIG. 11, the oRemove operation is performed with Message Transformation 108, SIDSS 110, and Message Broker 107 components of the CSIP 100. Among others, the Message Broker 107 performs an oPublish of the remove of the fundamental object instance.

Figure 12A:
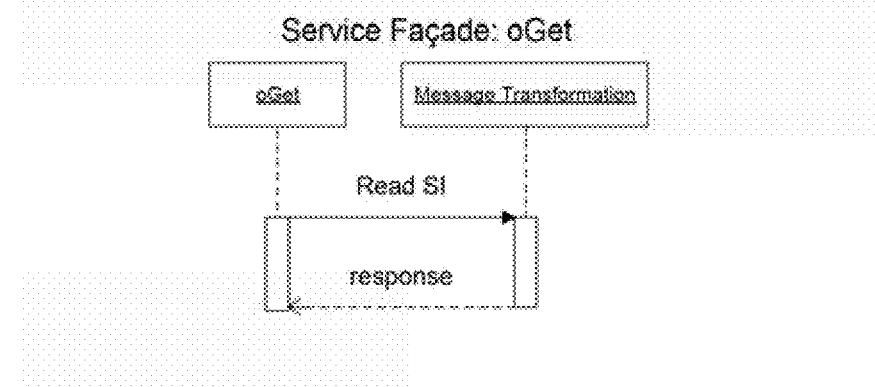
FIGS. 12A and 12B are simplified sequence diagrams for Service Façade operations oGet and uGet.
Figure 12B:
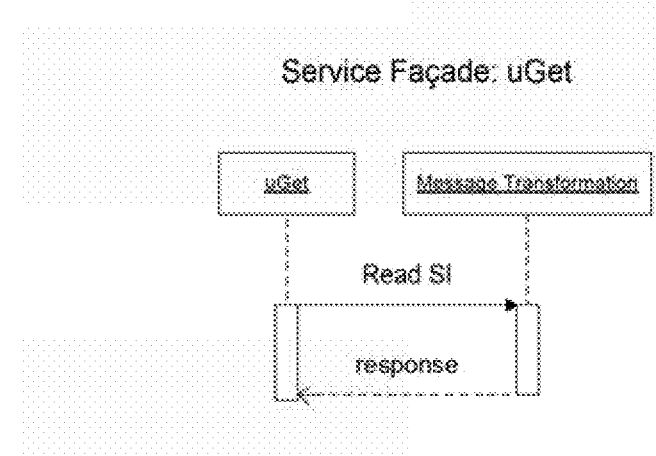
Figure 13A:
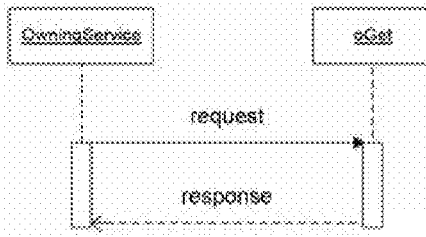
FIGS. 13A-D are simplified sequence diagrams for oGet and uGet usage patterns.
Figure 13B:
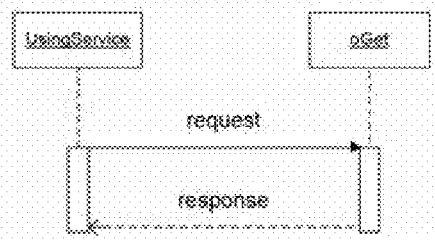
Figure 13C:
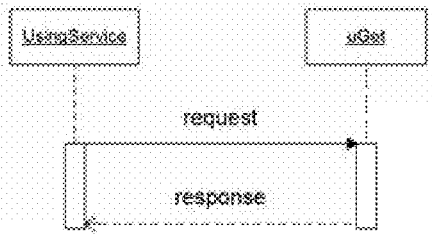
Figure 13D:
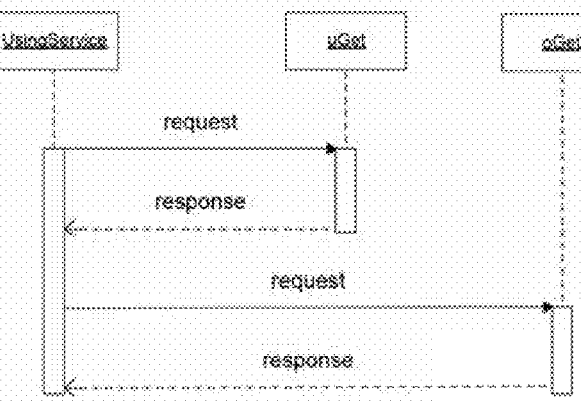

FIGS. 12A and 12B are simplified sequence diagrams for Service Façade operations oGet and uGet. These diagrams merely provide an example, which should not unduly limit the scope of the claims herein. One of ordinary skill in the art would recognize other variations, modifications, and alternatives. As shown in FIG. 12A, the oGet function is performed by the Message Transformation 108 component of the CSIP 100. FIG. 12B shows that the uGet function is performed by the Message Transformation 108 component of the CSIP 100.

FIGS. 13A-D are simplified sequence diagrams for usage patterns for operations oGet and uGet. This diagram is merely an example, which should not unduly limit the scope of the claims herein. One of ordinary skill in the art would recognize other variations, modifications, and alternatives. As an example, in FIG. 13A, to use oGet function, request of OwningService goes to OwningService'system of record (e.g., stored in the SDISS 200 in FIG. 2).

Figure 14:
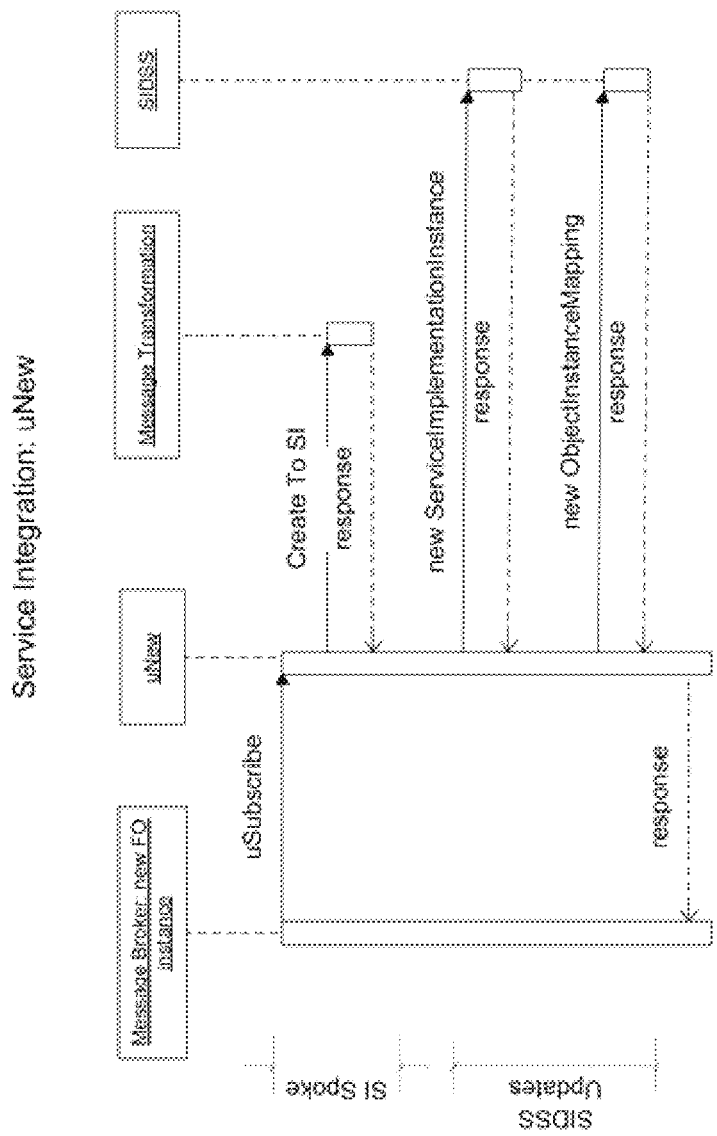
FIG. 14 is a simplified sequence diagram for Service Integration operation uNew.
Figure 15:
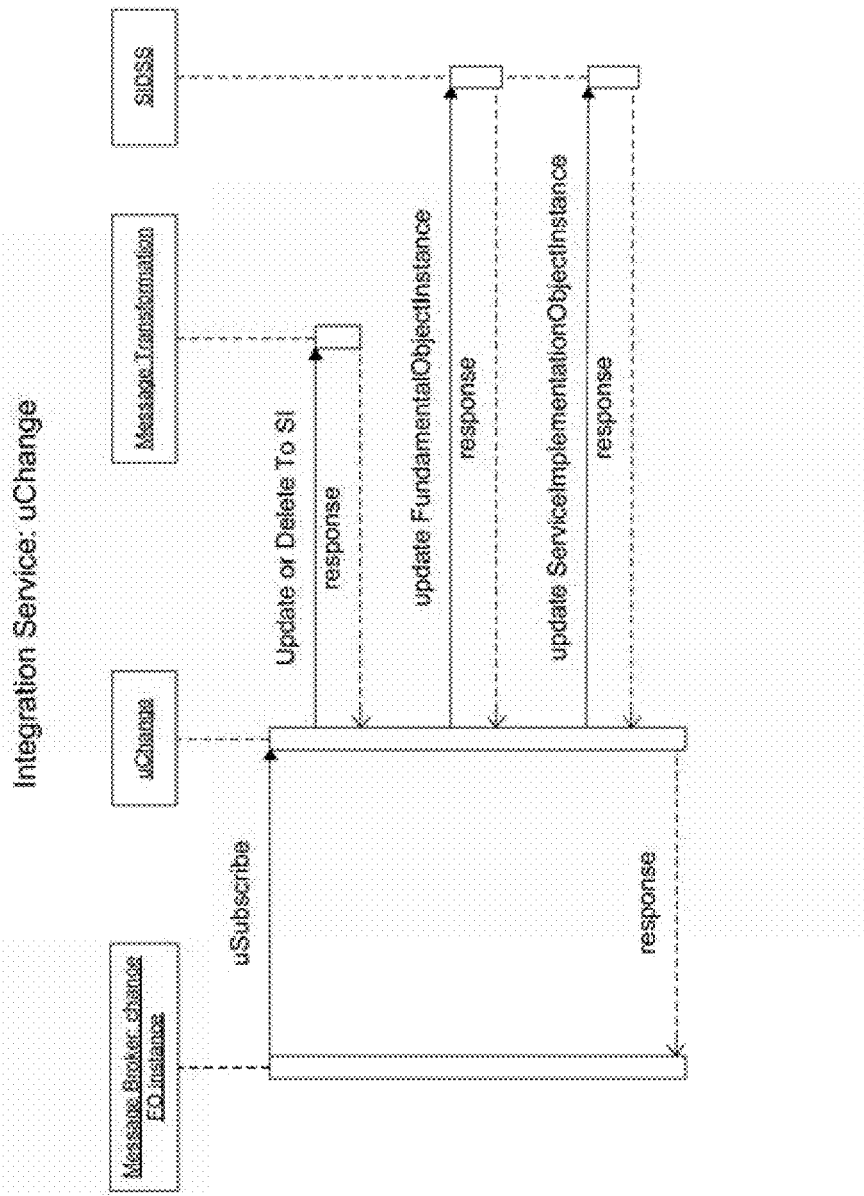
FIG. 15 is a simplified sequence diagram for Service Integration operation uChange.
Figure 16:
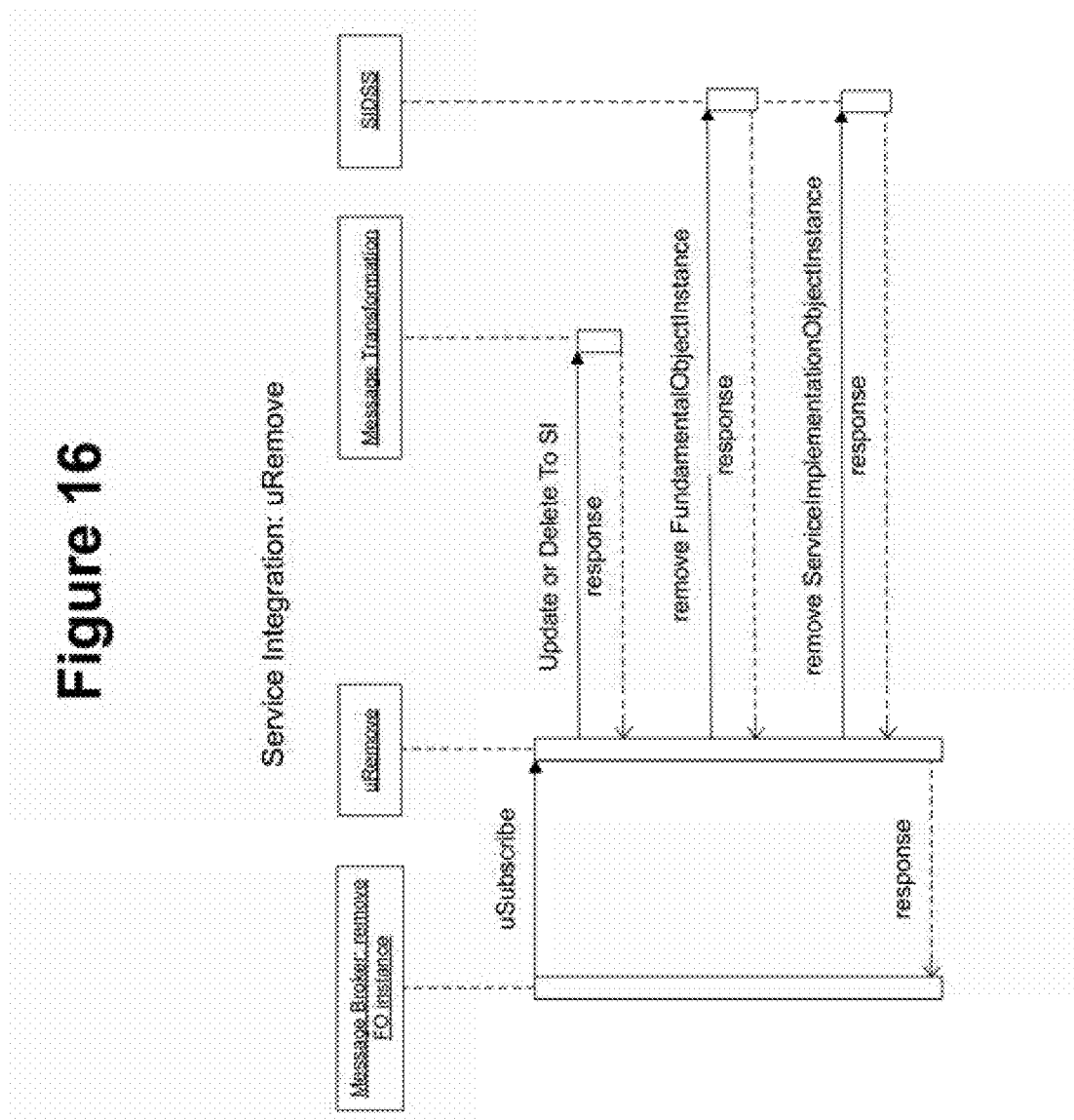
FIG. 16 is a simplified sequence diagram for Service Integration operation uRemove.

FIGS. 14-16 are sequence diagrams for operations performed by the Service Integration 106 component of the CSIP 100: uNew, uChange, and uRemove. While operations illustrated in FIGS. 14-16 are referred to with specific terms, it is to be understood that these operations and their variations can be referred to using other terms, and they should not unduly limit the claims. To perform operations of the Service Integration 106 component, these three steps are performed: (i) uSubscribe to the Message Broker 107 fundamental object queue; (ii) call the relevant Message Transformation 108 operator; and (iii) make the appropriate updates to the SIDSS 110 database.

FIG. 14 is a simplified sequence diagram for Service Integration operation uNew. This diagram is merely an example, which should not unduly limit the scope of the claims herein. One of ordinary skill in the art would recognize other variations, modifications, and alternatives. For example, one or more processes performed in FIG. 14 can be added, removed, modified, replaced, rearranged, repeated, and/or overlapped. As an example, the process starts with a new fundamental object (FO) instance, which calls for the uNew operation of the Service Integration 106. The uNew operation calls for Create To SI operation of the Message Transformation 108. Since a new FO is to be created, the relevant database tables of the SIDSS are updated.

FIG. 15 is a simplified sequence diagram for Service Integration operation uChange. This diagram is merely an example, which should not unduly limit the scope of the claims herein. One of ordinary skill in the art would recognize other variations, modifications, and alternatives. For example, one or more processes performed in FIG. 15 can be added, removed, modified, replaced, rearranged, repeated, and/or overlapped. As an example, the process starts with a change to a FO instance, which calls for the uChange operation of the Service Integration 106. The uChange operation calls for the Update or Delete To SI operation of the Message Transformation 108. Since an existing FO is to be changed, the relevant database tables (e.g., FundamentalObjectInstance and/or ServiceImplementationObjectInstance) of the SIDSS are updated.

FIG. 16 is a simplified sequence diagram for Service Integration operation uRemove. This diagram is merely an example, which should not unduly limit the scope of the claims herein. One of ordinary skill in the art would recognize other variations, modifications, and alternatives. For example, one or more processes performed in FIG. 16 can be added, removed, modified, replaced, rearranged, repeated, and/or overlapped. As an example, the process starts with a remove FO instance, which calls for the uRemove operation of the Service Integration 106. The uRemove operation calls for the Update or Delete To SI operation of the Message Transformation 108. Since an existing FO is to be removed, the relevant database tables (e.g., FundamentalObjectInstance and/or ServiceImplementationObjectInstance) of the SIDSS are updated.

The CSIP described in the present disclosure simplifies multi-tenant composite applications by standardizing the architecture, design patterns, and executable platform for service implementation and integration. This standard platform reduces risk, improves quality, shortens time-to-market, and lowers development and maintenance costs. The CSIP 100 is not just a set of design patterns; rather it is a platform that implements the design patterns. It is analogous to a relational database management system for service implementation and integration.

Additionally, the CSIP provides executable designs possible for service implementation and integration. This encourages domain design experiments with quick cycle times to improve such solutions. Use of the system can occur in four stages: (a) each domain design; (b) each service implementation; (c) each customer setup; and (d) customer instances that occur during runtime. Automating these makes it much easier to create and run multi-tenant composite applications. This is analogous to database design tools (e.g., ERWin) for service implementation and integration. For example, given two composite applications both use a function provided by the CSIP, neither application needs a specialized or customized version of that function, as the function is a standard CSIP function; to utilize this function for different uses, the SIDSS is configured accordingly. The composite applications have different information stored at the SIDSS, and the information stored at the SIDSS dictates how this function behaves when used by these two different applications.

Moreover, the CSIP provides the basis for solving the traceability problem for composite applications. It explicitly ties the executable code and configurations for service implementation and integration to the business context, conceptual services, logical design, and physical technologies. It makes executable designs possible.

Figure 17:
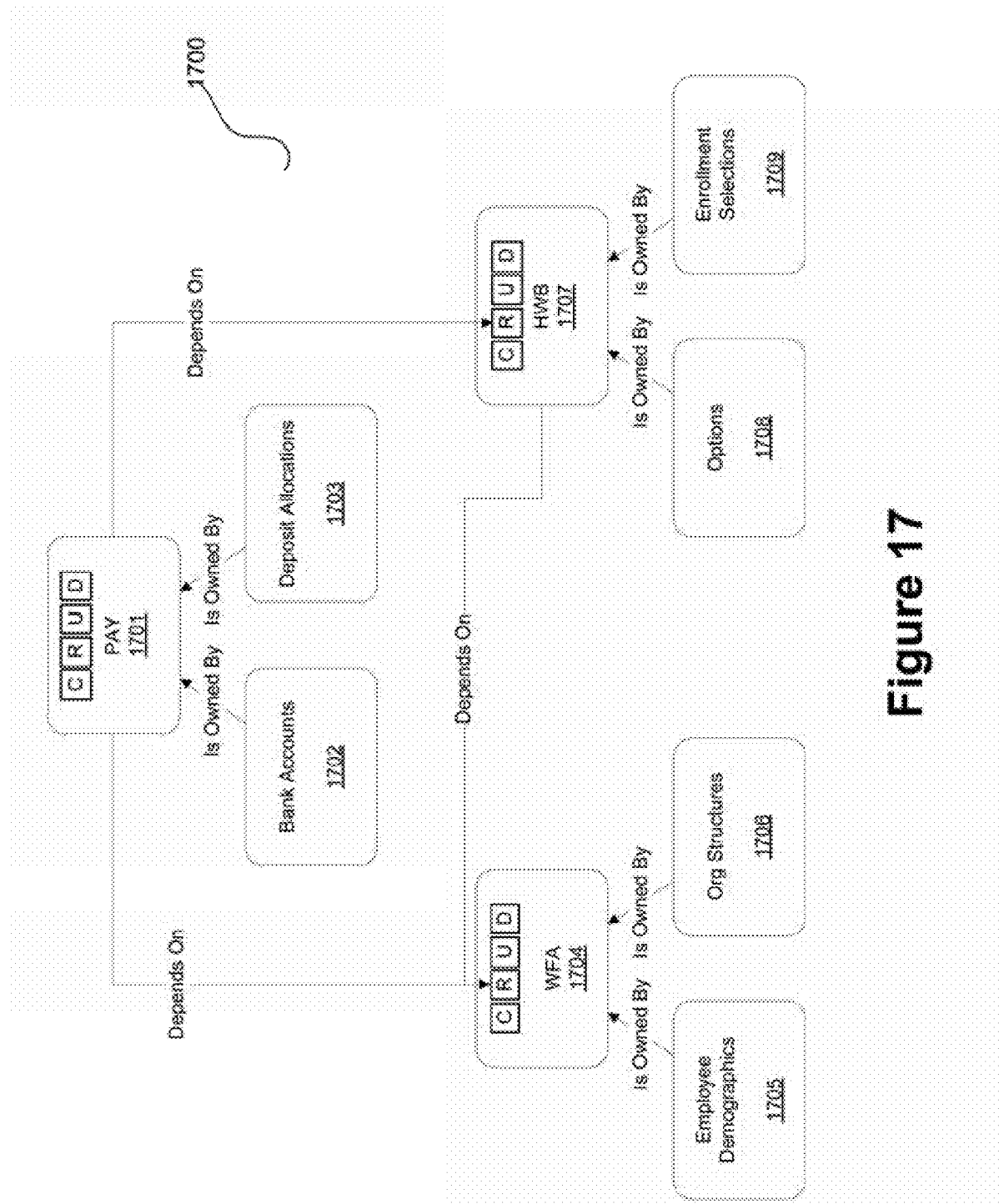
FIG. 17 is a simplified diagram illustrating a human resources conceptual services design.

FIG. 17 is a simplified diagram illustrating a human resources conceptual services design. This diagram is merely an example, which should not unduly limit the scope of the claims herein. One of ordinary skill in the art would recognize other variations, modifications, and alternatives. The human resources (HR) conceptual services design provides an example of using a CSIP. A composite application for HR domain 1700 comprises three services: Workforce Administration (WFA) 1704, Payroll Administration (PAY) 1701, and Health & Welfare Benefits (HWB) 1707. The Service WFA 1704 owns fundamental objects Employee Demographics 1705 and Org Structures 1706. The service PAY owns fundamental objects Bank Accounts 1702 and Deposit Allocations 1703. The service HWB 1707 own fundamental objects Options 1708 and enrollment Selections 1709. The services PAY 1701 and HWB 1707 both depend on the WFA 1704; Retrieve. The PAY 1701 also depends on the HWB 1707; Retrieve. For example, the domain model also includes the FundamentalObject Schemas.

Once the HR domain 1700 is set up, then service implementations for each of the services are listed. For example, SAP and/or Oracle applications can be used to implement the WFA 1704 and the PAY 1701. Automatic Data Processing as-a-service offerings can be used to implement PAY 1701. Towers Perrin and Hewitt implementations can be used for the HWB 1707. These are examples of populate HR service implementations that can be incorporated within the service ecosystem. It is to be understood these services can be implemented using other types of applications as well. Other users or entities might also have their own service implementations for these services. Finally, individual customers might have custom implementations or contracts with other third-party providers for one or more of WFA, PAY, and HWB.

For each of these service implementations, the ServiceImplementationObjects, their ServiceImplementationObject Schemas, and the XSLT mappings between these schemas and the FundamentalObject Schemas need be specified. For example, when implementing these services, relevant information is entered into the SIDSS database. Given the list of service implementations, each customer identifies their picks for the implementation of each of the services. New service messages for the various customers are automatically routed to the appropriate service implementations of the CSIP, and these messages are automatically processed appropriately. As described above, a user or customer simply identifies the implementation of service functionalities in order to use the CSIP functionalities, as opposed to redefining or customizing these services as commonly used in existing techniques. The parameters and behaviors of the components of the CSIP are standardized, thereby freeing the customer or user from having to create them from scratch for each solution.

Use of the CSIP is illustrated in the following two use cases. The operators are defined above. An arrow (→) indicates an initiating event arising from a source external to the CSIP.

To create a new employee, the following steps are performed:

| Create Employee |
| --- |
| Capture new Employee information (i.e., EmployeeName, EmployeeAddress)
→ WFA oNew EmployeeID = new Employee(EmployeeName, EmployeeAddress)
    includes WFA oPublish Employee(EmployeeID, EmployeeName, EmployeeAddress)
    PAY uSubscribe to uNew Employee(EmployeeID, EmployeeName, EmployeeAddress)
    HWB uSubscribe to uNew Employee(EmployeeID, EmployeeName, EmployeeAddress) |

For example, to create the new employee information, which includes name and address, the external source (e.g., and user) initiates the oNew operation by the WFA, which invokes the oPublish operation by the WFA. To use the oNew operation, the WFA access the oNew operation of the Service Façade component of the CSIP. The oPublish operation is processed by the Message Broker of the CSIP. The PAY and HWB services needs access to the new employee information, and to do that they utilize the uSubscribe operation of the Message Broker component the uNew operation of the Service Integration component.

To provide another example, the following steps are performed to update information for an existing employee:

| Update Employee Address |
| --- |
| Capture updated EmployeeAddress
→ WFA oChange Employee(EmployeeID, updated EmployeeAddress)
    includes WFA oPublish Employee(EmployeeID, updated EmployeeAddress)
  PAY uSubscribe to uChange Employee(EmployeeID, updated EmployeeAddress)
  Create "New Account and/or Change Deposit Allocation" case
    Employee is presented with option to add new Account and/or Change
Allocation
    Capture new Account and/or new Allocation from the Employee
→ PAY oNew AccountID = Account(AccountName, BankID, AccountRoutingNumber)
    → PAY oChange updated list of Allocation(EmployeeID, AccountID, DepositPercent)
  HWB uSubscribe to uChange Employee(EmployeeID, updated EmployeeAddress)
  Create "Update Enrollment Selections" case (e.g., with 30 day timer)
    Present Employee updated EligibilityOptions implied by updated EmployeeAddress
    Capture updated EnrollmentSelections from the Employee
→ HWB oChange updated list of EnrollmentSelections(EmployeeID, OptionID)
    Includes HWB oPublish updated list of EnrollmentSelections (EmployeeID, OptionID)
PAY uSubscribe to uChange updated list of EnrollmentSelections (EmployeeID, OptionID)
    PAY updates Employee's payroll deductions to reflect updated EnrollmentSelections |

Figure 18:
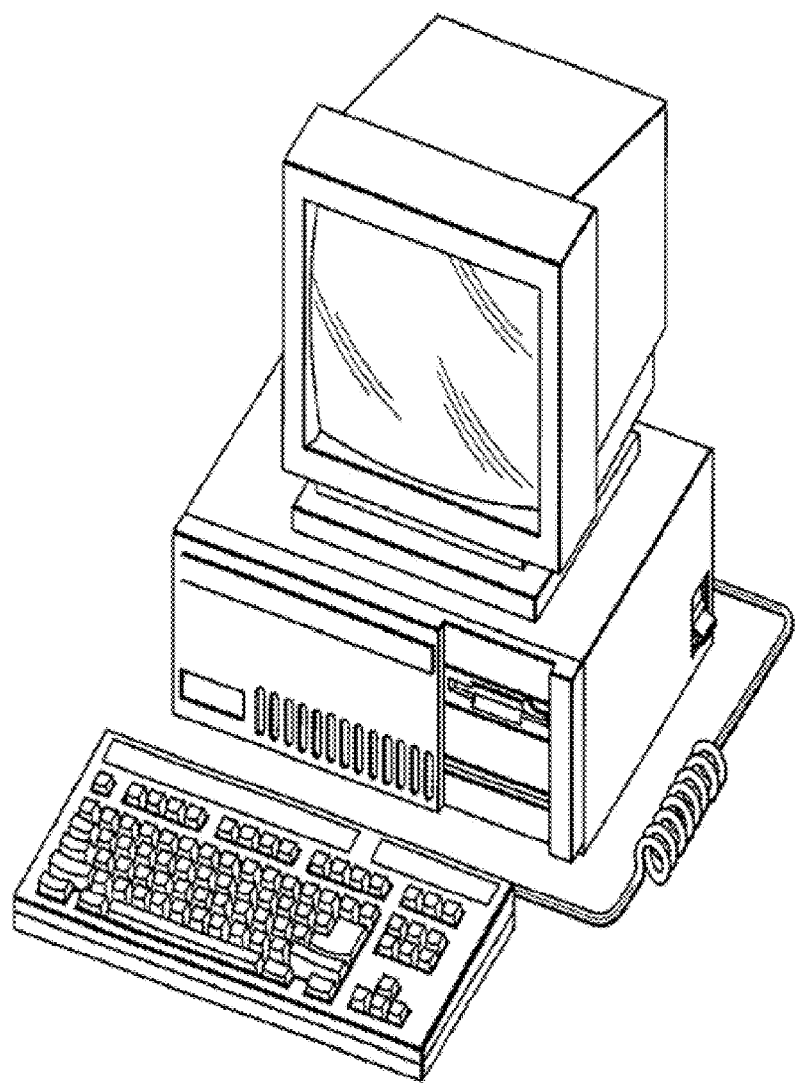
FIG. 18 is a simplified diagram illustrating a computer system that can be used to implement a CSIP system.

It is to be appreciated that the CSIP system described in the present disclosure may be implemented using various types of systems. FIG. 18 is a simplified diagram illustrating a computer system that can be used to implement a CSIP system. This diagram is merely an example, which should not unduly limit the scope of the claims herein. One of ordinary skill in the art would recognize other variations, modifications, and alternatives. For example, the computer system in FIG. 18 comprises a computer readable medium (e.g., hard disk, solid state memory, optical drive, etc.) that stores program instructions that can be executed by processors to perform various functions of the CSIP system and SIDSS databases. It is to be appreciated that CSIP systems can be implemented using a network computing device, including but not limited to SOA systems. There can be other embodiments as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method implemented with a processor equipped with one or more memory devices having stored thereon code instructions which, when executed by the processor, perform the method steps, comprising:
   identifying domain information, the domain information comprising information related to: a first conceptual service, a first fundamental object, and service dependency between the first conceptual service and a second conceptual service;
   identifying service implementation information, the service implementation information comprising information related to: a first set of service implementations that implement the first conceptual service, wherein each service implementation of the first set of service implementations is associated with a set of operations executable by a processing module;
   identifying customer configuration information that associates a first customer with at least one service implementation of the first set of service implementations;
   receiving, from the first customer, a first service request for an operation related to the first fundamental object;
   determining, based on the customer configuration information, a first service implementation for the first service request;
   determining whether the first fundamental object is owned by the first conceptual service or whether the first fundamental object is used by the first conceptual service but owned by another conceptual service;
   performing, based on the first service request, a first operation on the first fundamental object if the first fundamental object is owned by the first conceptual service; and
   performing, based on the first service request, a second operation, different from the first operation, on the first fundamental object if the first fundamental object is used by the first conceptual service but owned by the another conceptual service.

2. The method of claim 1, wherein the domain information comprises a database table for a plurality of conceptual services.

3. The method of claim 1, further comprising performing a service update operation.

4. The method of claim 1, further comprising storing the domain information, the service implementation information, and the customer configuration information in a database.

5. The method of claim 1, further comprising identifying operational information, wherein the operational information comprises information related to: the first operation that corresponds to the first fundamental object and the second operation that corresponds to the first fundamental object.

6. The method of claim 5, wherein the operational information comprises fundamental object instances, service implementation object instances, and mappings between them.

7. The method of claim 1, further comprising associating the customer information with conceptual services.

8. The method of claim 1, wherein the first operation comprises at least one of an oNew operation, an oGet operation, an oChange operation, and an oRemove operation, and
    the oNew operation is to create an instance of the first fundamental object in an owning service if the instance does not already exist,
    the oGet operation is to retrieve an instance of the first fundamental object from the owning service,
    the oChange operation is to update an instance of the first fundamental object in the owning service, and
    the oRemove operation is to delete an instance of the first fundamental object in the owning service; and
    wherein the second operation comprises a uGet operation, and the uGet operation is to retrieve an instance of the first fundamental object and its properties from a using service.

9. A non-transitory computer readable medium comprising instructions executable by a processor, the computer readable medium comprising:
    a service implementation and dependency support system (SIDSS) module to:
        provide information related to: a domain, conceptual services associated with the domain, a set of service implementations that implement each of the conceptual services, and customers associated with at least one service implementation of the set of service implementations;
        receive a service request from a particular customer for a particular conceptual service, the particular conceptual service associated with a particular set of service implementations that implement the particular conceptual service;
        identify, using at least the information related to the customers, a particular service implementation associated with the particular customer and the particular conceptual service; and
        route the service request to the particular service implementation to be processed;
    a service façade module to provide an oNew operation, an oGet operation, an oChange operation, an oRemove operation, and a uGet operation;
    a message broker module to provide an oPublish operation and an uSubscribe operation;
    a service integration module to provide a uNew operation, a uChange operation, and a uRemove operation; and
    a message transformation module to provide a Create From SI operation, a Create To SI operation, a Read SI operation, an Update or Delete From SI operation, and an Update or Delete To SI operation.

10. An apparatus comprising:
    a non-transitory computer readable medium storing instructions; and
    a processor to execute the instructions to:
    store domain information, comprising information related to: conceptual services, fundamental objects owned or used by individual conceptual services, and service dependency among the conceptual services;
    store service implementation information comprising information related to:
        a set of service implementations associated with each of the conceptual services, wherein each service implementation of the set of service implementations is associated with a set of operations executable by the processor;
    store customer configuration information that associates a particular customer with a particular service implementation of a particular conceptual service;
    receive, from the particular customer, a service request for an operation related to a first fundamental object;
    identify, based on the customer configuration information, the particular service implementation associated with the particular customer;
    determine whether the first fundamental object is owned by the particular conceptual service or whether the first fundamental object is used by the particular conceptual service but owned by another one of the conceptual services;
    perform, based on the service request, a first operation on the first fundamental object if the first fundamental object is owned by the particular conceptual service; and
    perform, based on the service request, a second operation, different from the first operation, on the first fundamental object if the particular fundamental object is used by the first conceptual service implementation but owned by the another one of the conceptual services.

11. The apparatus of claim 10, wherein the first operation comprises at least one of an oNew operation, an oGet operation, an oChange operation, and an oRemove operation, and
    the oNew operation is to create an instance of the first fundamental object in an owning service if the instance does not already exist,
    the oGet operation is to retrieve an instance of the first fundamental object from the owning service,
    the oChange operation is to update an instance of the first fundamental object in the owning service, and
    the oRemove operation is to delete an instance of the first fundamental object in the owning service; and
    wherein the second operation comprises a uGet operation, and the uGet operation is to retrieve an instance of the first fundamental object and its properties from a using service.

* * * * *